(12) United States Patent
Kondo

(10) Patent No.: US 9,667,222 B2
(45) Date of Patent: May 30, 2017

(54) RESONATION DEVICE, METHOD OF MANUFACTURING RESONATION DEVICE, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 315 days.

(21) Appl. No.: 14/220,783

(22) Filed: Mar. 20, 2014

(65) Prior Publication Data

US 2014/0292154 A1    Oct. 2, 2014

(30) Foreign Application Priority Data

Mar. 29, 2013   (JP) ................................ 2013-071576

(51) Int. Cl.
*H03H 9/10*      (2006.01)
*H01L 41/053*    (2006.01)
*H03H 9/05*      (2006.01)

(52) U.S. Cl.
CPC ....... *H03H 9/1021* (2013.01); *H01L 41/0533* (2013.01); *H03H 9/0552* (2013.01); *Y10T 29/42* (2015.01)

(58) Field of Classification Search
CPC .. H01L 41/047; H01L 41/053; H01L 41/0533
USPC .................................................. 310/348, 365
See application file for complete search history.

(56) References Cited

U.S. PATENT DOCUMENTS

| 6,236,145 | B1 * | 5/2001 | Biernacki ............ H03H 9/0523 310/346 |
| 2004/0021402 | A1 | 2/2004 | Morley et al. |
| 2006/0290239 | A1 | 12/2006 | Kasahara et al. |
| 2010/0219723 | A1 * | 9/2010 | Nozoe ................ H03H 9/02133 310/348 |

FOREIGN PATENT DOCUMENTS

| JP | H04-315464 A | 11/1992 |
| JP | 2005-528829 A | 9/2005 |
| JP | A-2007-6270 | 1/2007 |
| JP | 2010-213015 A | 9/2010 |

* cited by examiner

*Primary Examiner* — Derek Rosenau
(74) *Attorney, Agent, or Firm* — Oliff PLC

(57) ABSTRACT

A method of manufacturing resonation device (a quartz crystal oscillator) includes the steps of applying a thermosetting thermal insulating connection material and an electrically-conductive connection material, which is higher in curing temperature than the thermosetting thermal insulating connection material, on a principal surface of a substrate, mounting fixation terminals of a resonator (a quartz crystal resonator), which has a heating element, and to which the fixation terminals and connection terminals are connected, in application positions of the insulating connection material on the substrate, and connection terminals in application positions of the electrically-conductive connection material, and heating the insulating connection material and the electrically-conductive connection material based on a reflow profile to make the insulating connection material and the electrically-conductive connection material cure in this order.

10 Claims, 5 Drawing Sheets

RESONATION DEVICE, METHOD OF MANUFACTURING RESONATION DEVICE, ELECTRONIC APPARATUS, AND MOVING OBJECT

BACKGROUND

1. Technical Field

The present invention relates to a resonation device, a method of manufacturing a resonation device, and an electronic apparatus and a moving object each using a resonation device.

2. Related Art

Since quartz crystal oscillators vary in frequency with respect to a variation in temperature, there are used constant-temperature quartz crystal oscillators in which the temperature of the quartz crystal resonator is kept at a constant level by heating the quarts crystal resonator using a heating element such as a heater. In such a constant-temperature quartz crystal oscillator, if the quarts crystal resonator and the heating element are directly mounted on a substrate constituting a part of a thermostatic chamber, the heat of the quarts crystal resonator and the heating element is released to the substrate. Therefore, it becomes difficult to keep the temperature of the quarts crystal resonator constant, and if it is attempted to keep the temperature of the quartz crystal resonator constant, a larger amount of power must be supplied to the heating element, and therefore, there is a problem that the power consumption increases.

In order to solve the problem described above, in JP-A-2007-6270 (Document 1), there is disclosed a structure in which a gap is disposed between the substrate and the quartz crystal resonator in connecting/fixing the quartz crystal resonator provided with the heating element and the substrate to each other with a lead wire.

In such a configuration, according to Document 1, the gap is disposed between the substrate and the quartz crystal resonator to thereby inhibit the heat of the quartz crystal resonator from being released to the substrate. However, since the lead wire performs both of the electrical connection and the mechanical fixation between the quartz crystal resonator and the substrate, the connection between the quartz crystal resonator and the substrate is achieved by the lead wire having mechanical strength, silver solder, and so on. Therefore, when connecting the lead wires to the substrate by melting the silver solder, the silver solder of ail of the terminals melts at a time. Therefore, if the substrate is tilted, or an external force such as a vibration is applied to the substrate or the quarts crystal resonator, there is a case in which the connection position between the substrate and the quartz crystal resonator, and the lead wire is shifted to cause a connection failure when the silver solder is melted. Therefore, there is a possibility of causing an electrical or mechanical connection failure, and thus, the reliability of the product is deteriorated.

SUMMARY

An advantage of some aspects of the invention is to solve at least a part of the problems described above, and the invention can be implemented as the following aspects and application examples.

Application Example 1

This application example is directed to a reservation device including a resonator, a substrate, a fixation terminal adapted to mechanically fixing the resonator and the substrate to each other, and a connection terminal adapted to electrically connect the resonator and the substrate to each other, the connection between the fixation terminal and the substrate is achieved by an insulating connection material, and the connection terminal and the resonator, and the connection terminal and the substrate axe each connected to each other with an electrically-conductive connection material.

According to such a configuration as described above, since the connection terminal for achieving the electrical connection and the fixation terminal for achieving the mechanical fixation are functionally separated, the insulating connection material is used for the connection between the resonator and the substrate with the fixation, terminal, the electrically-conductive connection material is used for the connection between the resonator and the substrate with the connection terminal, and the connection material is made different by the function of the terminal, the fixation terminal can be made sufficiently high in mechanical strength for fixing the resonator. As a result, since the resonator can solidly be fixed to the substrate, no displacement is caused when connecting the connection terminal and the substrate to each other, and thus, the reliability of the product is enhanced.

Application Example 2

It the resonation device according to the application example described above, it is preferable that the insulating connection material and the electrically-conductive connection material are each a thermosetting connection material, and the electrically-conductive connection material, is higher in curing temperature than the insulating connection material.

Application Example 3

In the resonation device according to the application example described above, it is preferable that the insulating connection material is a thermosetting connection material, the electrically-conductive connection material is a heat-melting connection material, and melting temperature of the electrically-conductive connection material is higher than curing temperature of the insulating connection material.

By adopting such a configuration, it is possible that in the case of connecting or fixing the resonator to the substrate, the fixation of the fixation terminal is performed first in the lower temperature range to limit the position and the posture of the resonator with respect to the substrate, and then the connection/fixation of the connection terminal is performed. Therefore, there is no chance for the resonator to be fixed in the state in which the position or the posture with respect to the substrate is shifted in the process performed before the fixation of the connection terminal.

Application Examples 4, 5, and 6

In the resonation device according to the application example described above, it is preferable that the connection terminal includes a first connection terminal section connected to the resonator, a second connection terminal section connected to the substrate, and a third connection terminal section adapted to connect the first connection terminal section and the second connection terminal section to each other, the fixation terminal includes a first fixation terminal section connected to the resonator, a second fixation terminal section connected to the substrate, and a third fixation terminal section adapted to connect the first fixation terminal section and the second fixation terminal section to each other, and the third fixation terminal section is higher in rigidity than the third connection terminal section.

Since the mechanical connection function between the resonator and the substrate is required for the fixation terminal, the fixation terminal is required to be high in mechanical strength. Therefore, since the resonator can solidly be fixed to the substrate by setting the rigidity of the fixation terminal to be higher than the rigidity of the connection terminal, no displacement is caused when connecting the connection terminal and the substrate to each other, and thus, the reliability of the product is enhanced.

Application Example 7

This application example is directed to a method or manufacturing a resonation device having a resonator, to which a fixation terminal and a connection terminal are connected, and a substrate, the method including mounting the fixation terminal in a position of the substrate where a thermosetting insulating connection material is disposed, and the connection terminal in a position of the substrate where an electrically-conductive connection material is disposed, and making the insulating connection material and the electrically-conductive connection material cure in this order.

According to such a manufacturing method as described above, the fixation terminal is first fixed to the substrate with the insulating connection material, and then the connection terminal is fixed to the substrate with the electrically-conductive connection material. Therefore, since the resonator to which the fixation terminal and the connection terminal are connected is fixed to the substrate in the early stage of the process of fixing the resonator to the substrate, there is no chance for the position and the posture of the connection terminal with respect to the substrate to be shifted, and thus, the connection terminal can accurately be fixed to the substrate.

Application Example 8

In the method of manufacturing a resonation device according to the application example described above, it is preferable that the insulating connection material and the electrically-conductive connection material are each a thermosetting connection material, and the electrically-conductive connection material is higher in curing temperature than the insulating connection material.

Application Example 9

In the method of manufacturing a resonation device according to the application example described above, it is preferable that the insulating connection material is a thermosetting connection material, the electrically-conductive connection material is a heat-melting connection material, and melting temperature of the electrically-conductive connection material is higher than curing temperature of the insulating connection material.

By adopting such a configuration as described above, it is possible to complete solidification of the insulating connection material before the meltage of the electrically-conductive connection material begins. In other words, by adopting the process sequence of fixing the connection terminal after fixing the fixation terminal, the connection terminal can be fixed to the predetermined position of the substrate while preventing the position and one posture of the resonation device with respect to the substrate from being shifted in the process for fixing the connection terminal to the substrate.

Application Example 10

This application example is directed to an electronic apparatus including the resonation device described above.

Since such an electronic apparatus as described above is equipped with the reservation device having the resonator solidly fixed to the substrate, it is possible to provide an electronic apparatus, which is capable of accurately detecting characteristics, robust over impacts and vibrations, and provided with high reliability.

Application Example 11

This application example is directed to a moving object including the resonation device described above.

Since the moving object is equipped with the resonation device having the resonator solidly fixed to the substrate, it is possible to realize a moving object, which is capable of accurately detecting characteristics, robust over impacts and vibrations, and provided with high reliability.

BRIEF DESCRIPTION OF THE DRAWINGS

The invention will be described with reference to the accompanying drawings, wherein like numbers reference like elements.

DESCRIPTION OF AN EXEMPLARY EMBODIMENT

An embodiment of the invention will hereinafter be explained with reference to the accompanying drawings.

It should be noted that in the present embodiment, the explanation will be presented citing a quartz crystal oscillator 1, which uses a quartz crystal resonator 10 as the resonator, as an example of the resonation device.

Further, the drawings referred to in the following explanation are schematic diagrams, in which the contraction scales in the vertical and horizontal directions of each of the constituents or the parts are different from the actual ones, in order to make the constituents have recognizable sizes.

Configuration of Quartz Crystal Oscillator

Figure 1:
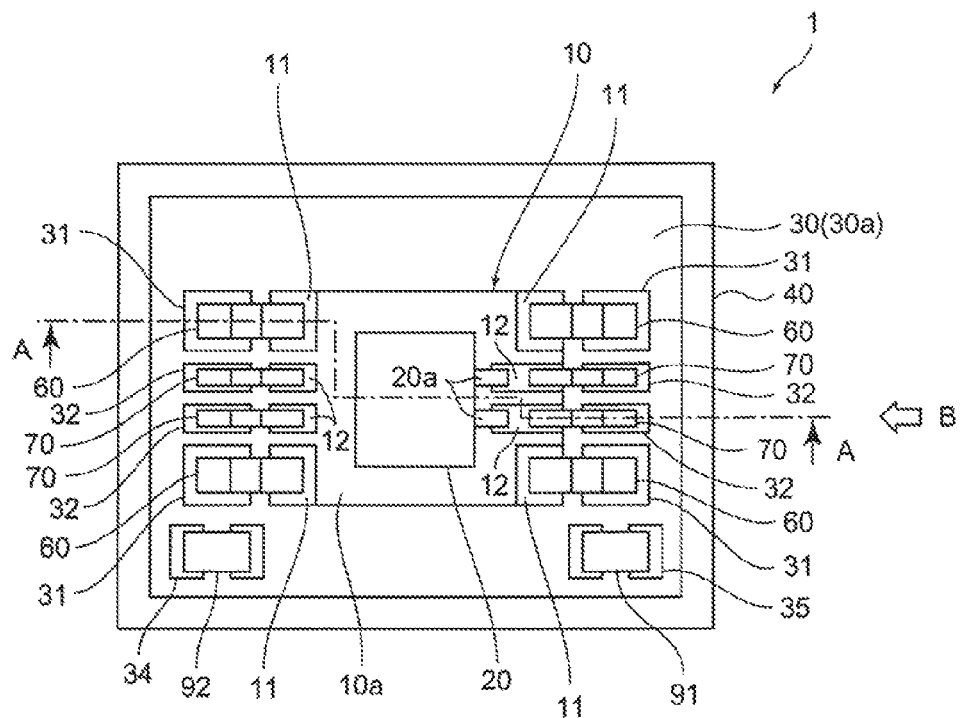
FIG. 1 is an internal plan view of a quartz crystal oscillator according to the invention.
Figure 2:
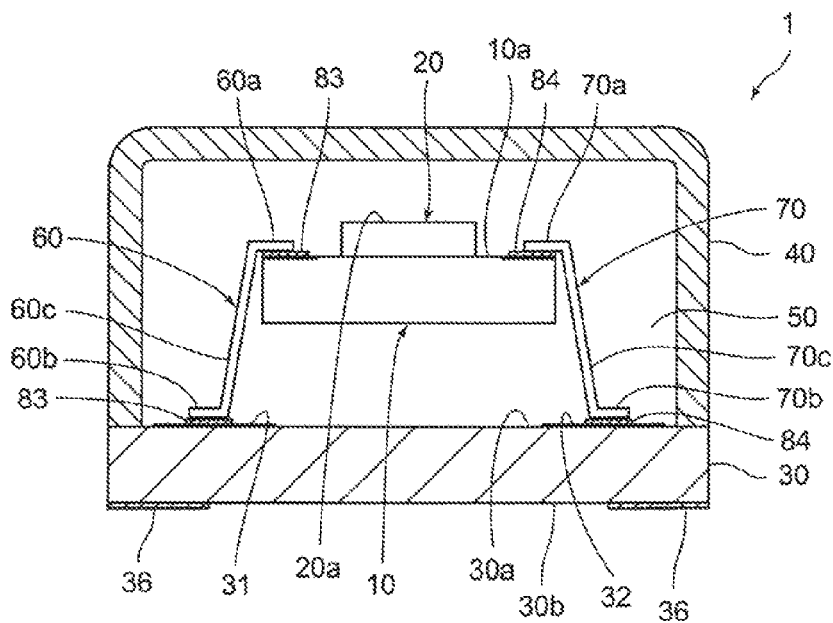
FIG. 2 is a cross-sectional view shoving an A-A cut surface in FIG. 1.
Figure 3:
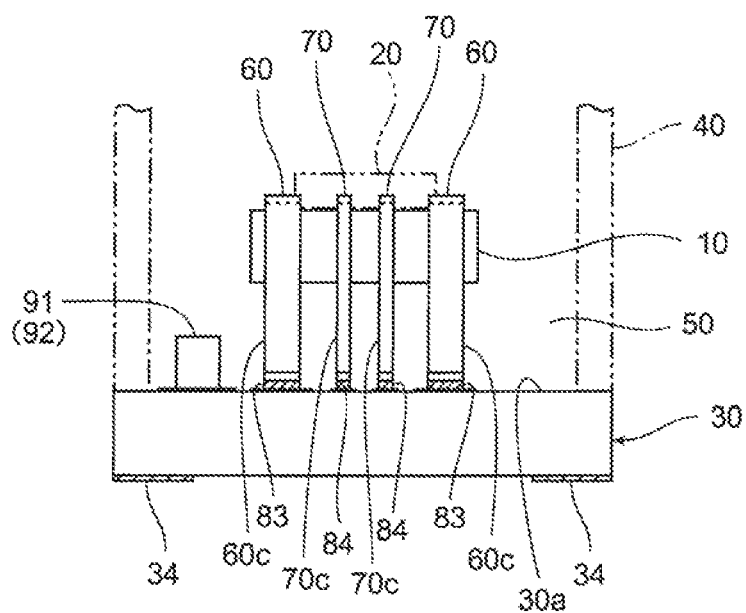
FIG. 3 is a side view viewed from the direction of the arrow B shown in Fig. 1.

FIG. 1 is an internal plan view of the quartz crystal oscillator 1 as the resonation device, FIG. 2 is a cross-sectional view showing an A-A cut surface in FIG. 1, and FIG. 3 is a side view viewed from the direction of the arrow B shown in FIG. 1. As shown in FIGS. 1 through 3, the quartz-crystal oscillator 1 is provided with a quartz crystal resonator 10 as the resonator housed in a space 50 surrounded by a substrate 30 and a lid member 40. A heating element 20 is attached to a central portion of a principal surface 10a of the quartz crystal resonator 10. The quartz crystal resonator 10 is separated from, the external space with the space 50.

The quartz crystal resonator 10 and the substrate 30 are connected/fixed to each other with a plurality of fixation terminals 60 and a plurality of connection terminals 70 so as to have a gap therebetween in a thickness direction or the quartz crystal resonator 10 and the substrate 30. The fixation terminals 60 mechanically fix the quartz crystal resonator 10 and the substrate 30 to each other, and the connection terminals 70 electrically connect the quartz crystal resonator 10 and the substrate 30 to each other.

Although not shown in the drawings, the quartz crystal resonator 10 is composed of a quartz crystal resonator element provided with excitation electrodes, and a ceramic package for airtightly housing the quartz crystal resonator element. As shown in FIG. 1, the quartz crystal resonator 10 is provided with electrodes 11 disposed on four corners of the principal surface 10a, and electrodes 12 disposed between two of the electrodes 11. The electrodes 11 are each an electrically floating fixation land. The electrodes 12 are electrodes electrically connected to a pair of excitation electrodes of the quartz crystal resonator element. It should be noted that the arrangement of the electrodes 11 and the electrodes 12 is not limited to the arrangement shown in the drawing, but it is preferable to arrange the electrodes 11 on the four corners of the quartz crystal resonator 10 in order to fix the quartz crystal resonator 10 to the substrate with the fixation terminals 60 in a stabilized manner. A part of the substrate 30 included in the space 50 surrounded by the substrate 30 and the lid member 40 is provided with an oscillator circuit 91 and a heating element control circuit 92.

In the present embodiment, the heating element 20 is an element including a power transistor as a heater and a temperature-sensitive element (a thermosensor), wherein element electrodes 20a for electrical connection are disposed on a side surface of the element, and are fixed to wiring lines 12 formed on the principal surface 10a of the quartz crystal resonator 10 with a bonding material such as an adhesive high in thermal conductivity or solder. It should be noted that the power transistor and the temperature-sensitive element can be formed as respective chips separated from each other, or a resistance heating element can be used instead of the power transistor. Further, the heating element 20 can be connected to the substrate 30 using wire bonding or the like without intervention of the wiring lines formed on the principal surface of the quartz crystal resonator 10. Further, the temperature-sensitive element can be provided to the heating element control circuit 92.

The substrate 30 is a circuit board, and electrode patterns are formed on the principal surface 30a and the reverse surface 30b. On the principal surface 30a, there are disposed fixation lands 31 on which the fixation terminals 60 are disposed, connection electrodes 32 on which the connection terminals 70 are disposed, and element electrodes 34, 35 to which the oscillator circuit 91 and the hearing element control circuit 92 are respectively connected/fixed. On the reverse surface 30b of the substrate 30, there are further disposed external electrodes 36 for connecting the quartz crystal oscillator 1 to the equipment on which the quartz crystal oscillator 1 is mounted.

The oscillator circuit 91 includes an oscillating circuit section and an amplifying circuit section. The quartz crystal resonator 10, the oscillating circuit section, and the amplifying circuit section constitute an oscillation circuit. In the case in which the quartz crystal resonator 10 is an AT-cut quartz crystal oscillator, the oscillation circuit is a feedback oscillation circuit in which the quartz crystal resonator 10 is oscillated by the oscillating circuit section, the oscillation output is amplified by the amplifying circuit section, and the result is partially fed back to the oscillating circuit section, and an output signal with an accurate frequency is output from the quartz crystal oscillator 1. It should be noted that the oscillation circuit can include a frequency temperature compensation circuit for compensating the frequency-temperature characteristic.

The heating element control circuit 92 includes a temperature control circuit for controlling the temperature of the quarts crystal resonator 10 so as to be kept in predetermined constant temperature by controlling the supply power to the heating element 20 based on the detection output or the temperature-sensitive element.

The fixation terminals 60 and the connection terminals 70 are each a metal terminal formed of a material such, as kovar or 42Alloy. The fixation terminals 60 are each a thin plate-like terminal formed by integrating a first fixation terminal section 60a as a connection section bent so as to be fixed to the quartz crystal resonator 10, a second fixation terminal section 60b as a connection section bent so as to be fixed to the substrate 30, and a third fixation terminal section 60c connecting the first fixation terminal section 60a and the second fixation terminal section 60b to each other.

The connection terminals 70 are each a thin plate-like terminal formed by integrating a first connection terminal section 70a as a connection section bent so as to be fixed to the quartz crystal resonator 10, a second connection terminal section 70b as a connection section bent so as to be fixed to the substrate 30, and a third connection terminal section 70c connecting the first connection terminal section 70a and the second connection terminal section 70b to each other.

As shown in FIGS. 1 and 3, the width of the third connection terminal section 70c is smaller than the width of the third fixation terminal section 60c. In other words, the cross-sectional area of the third connection terminal section 70c along the width direction is smaller than the cross-sectional area of the third fixation terminal section 60c along the width direction. Further, an area (a connection area) where the first connection, terminal section 70a overlaps the quartz crystal resonator 10 in a plan view, and an area (a connection area) where the second connection terminal section 70b overlaps the substrate 30 in the plan view are smaller than an area (a connection area) where the first fixation terminal section 60a of the fixation terminal 60 overlaps the quartz crystal resonator 10 in the plan view, and an area (a connection area) where the second fixation terminal section 60b overlaps the substrate 30 in the plan view. This means that in the case in which the fixation terminal 60 and the connection terminal 70 are alone, and the fixation terminal 60 and the connection terminal 70 are made of the same material, the connection terminal 70 is lower in mechanical strength than the fixation terminal 60.

Then, connection and fixation structures between the quartz crystal resonator 10 and the substrate 30 will be explained. The fixation of each of the fixation terminals 60 to the quartz crystal resonator 10 and the substrate 30 is achieved in the first fixation terminal section 60a and the second fixation terminal section 60b using an insulating connection material 83 of a thermosetting type. As the insulating connection material 83, there can be cited, for example, a thermosetting epoxy adhesive. It should be noted that it is not required to use the same material as the insulating connection material between the quartz crystal resonator 10 side and the substrate 30 side. For example, if is possible to adopt a combination of an electrically-conductive connection material used on the quartz crystal resonator 10 side and the insulating connection material used on the substrate 30 side, or a combination of the insulating connection material used on the quartz crystal resonator 10 side and the electrically-conductive connection material used on the substrate 30 side.

The connection of each of the connection terminals 70 to the quartz crystal resonator 10 and the substrate 30 is achieved in the first connection terminal section 70a and the second connection terminal section 70b using an electrically-conductive connection material 84. As the electrically-conductive connection material 84, there can be cited, for example, a thermosetting electrically-conductive adhesive. It should be noted that the electrically-conductive connection material is not limited to the thermosetting electrically-conductive adhesive, solder can also be used as the electrically-conductive connection material.

In the present embodiment, the insulating connection material 83 and the electrically-conductive connection material 84 are both the thermosetting connection materials, and the curing temperature of the electrically-conductive connection material 84 is set higher than that of the insulating connection material 83. In other words, the quartz crystal resonator 10 is fixed to the substrate 30 with the fixation terminals 60 at lower heating temperature, and then, when the heating temperature reaches a higher level, the quartz crystal resonator 10 and the substrate 30 are electrically connected to each other with the connection terminals 70.

Further, in the case of using the thermosetting connection material as the insulating connection material 83 and solder as the electrically-conductive connection material 84, the curing temperature of the insulating connection material 83 is set to be lower than the melting temperature of the solder. In other words, the quartz crystal resonator 10 is fixed to the substrate 30 with the fixation terminals 60 at lower heating temperature, and then, when the heating temperature reaches a higher level, the quartz crystal resonator 10 and the substrate 30 are electrically connected to each other with the connection terminals 70.

As shown in FIG. 1, the quartz crystal resonator 10, the heating element 20, and the substrate 30 are electrically connected to each other with the connection terminals 70. The quartz crystal resonator 10 and, the oscillator circuit 91, and the heating element 20 and the heating element control circuit 92 are each connected to each other using an electrode patterns not shown provided to the substrate 30.

It is known that the quarts crystal resonators vary in resonant frequency due to the temperature variation. The frequency-temperature characteristic is expressed by a quadratic or cable curve having temperature at which the frequency variation takes a minimal value. Therefore, by keeping the temperature of the quartz crystal resonator in the vicinity of the temperature at which the frequency variation takes the minimal value, the quartz crystal oscillator small in resonance frequency variation can be realized. The quartz crystal oscillator 1 according to the present embodiment is a device, which heats the quartz crystal resonator 10 using the heating element 20 to keep the quartz crystal resonator 10 at constant temperature in the vicinity of the temperature at which the frequency variation takes the minimal value in order to suppress the resonant frequency variation due to the temperature variation.

The quartz crystal oscillator 1 has the quartz crystal resonator 10 attached with the heating element 20 housed inside the space 50 surrounded by the substrate 30 and the lid member 40, and is provided with the fixation terminals 60 for fixing the quartz crystal resonator 10 and the substrate 30 to each other so as to provide the gap therebetween, and the connection terminals 70 for electrically connecting the quartz crystal resonator 10 and the substrate 30 to each other. The fixation between the fixation terminals 60, and the quartz crystal resonator 10 and the substrate 30 is achieved using the insulating connection material 83, and the connection between the connection terminals 70, and the quartz crystal resonator 10 and the substrate 30 is achieved using the electrically-conductive connection material 84.

In the present embodiment, the thermosetting connection materials are used as both of the electrically-conductive connection material 84 and the insulating connection material 83, and the curing temperature of the electrically-conductive. connection material 84 is set higher than the curing temperature of the insulating connection material 83.

By adopting such a configuration, it is possible that in the case of connecting or fixing the quartz crystal resonator 10 to the substrate 30, the fixation of the fixation terminals 60 is performed first in the lower temperature range to limit the position and the posture of the quartz crystal resonator 10 with respect to the substrate 30, and then the connection/fixation of the connection terminals 70 is performed. Therefore, there is no chance for the quartz crystal resonator 10 to be fixed in the state in which the position or the posture with respect to the substrate 30 is shifted in the process performed before the fixation of the connection terminals 70.

Further, in the case of using the thermosetting connection material as the insulating connection material 83 and solder as the electrically-conductive connection material 84, substantially the same advantage can be obtained by setting the curing temperature of the insulating connection material 83 to be lower than the melting temperature of the solder. Specifically, it is possible that in the case of connecting or fixing the quartz crystal resonator 10 to the substrate 30, the fixation of the fixation terminals 60 is performed first in the lower temperature range in which the solder is not melted to limit the position and the posture of the quartz crystal resonator 10 with respect to the substrate 30, and then the connection/fixation of the connection terminals 70 is achieved by the solder melted and then solidified. Therefore, there is no chance for the quartz crystal resonator 10 to be fixed in the state in which the position or the posture with respect to the substrate 30 is shifted in the process performed before the fixation of the connection terminals 70.

Further, in general, insulating materials are low in thermal conductivity compared no electrically-conductive materials. Therefore, since the insulating connection material 83 is made to intervene in the connection section between the quartz crystal resonator 10 and the substrate 30 using the fixation terminals 60, the heat transfer from the quartz crystal resonator 10 to the substrate 30 via the fixation terminals 60 is smaller in amount than the heat transferred from the connection terminals 70 to the substrate 30. Therefore, by using the configuration of the present embodiment, the heat transfer from the quartz crystal resonator 10 to the substrate 30 can be suppressed compared to the case of connecting the quartz crystal resonator 10 to the substrate 30 using the electrically-conductive connection material 84 in all of the fixation terminals 60 and the connection terminals

70. Therefore, since the temperature of the quartz crystal resonator 10 can be kept without increasing the power supply to the heating element 20, the advantage of achieving the low power consumption can also be obtained.

Further, since it is sufficient for the connection terminals 70 to have an electrical connection function between the quartz crystal resonator 10 and the substrate 30, the mechanical strength can be lower than that of the fixation terminals. Therefore, the cross-sectional area of the third connection terminal section 70c along the width direction is set to be smaller than the cross-sectional area of the third fixation terminal section 60c along the width direction. Further, the area (the connection area) where the first connection terminal section 70a and the quartz crystal resonator 10 overlap each other in the plan view and the area (the connection area) where the second connection terminal section 70b and the substrate 30 overlap each other in the plan view in the connection terminals 70 are set to be smaller than the area (the connection area) where the first fixation terminal section 60a and the quartz crystal resonator 10 overlap each other in the plan view and the area (the connection area) where the second fixation terminal section 60b and the substrate 30 overlap each other in the plan view in the fixation terminals 60. By adopting such a configuration as described above, the fixation terminals 60 become higher in mechanical strength than the connection terminals 70, and the quartz crystal resonator 10 can stably be held on the substrate 30. Further, since a large gap can be provided between the quartz crystal resonator 10 and the substrate 30 due to the fixation terminals 60 high in mechanical strength, there can also be obtained an advantage of suppressing the heat radiation from the quartz crystal resonator 10.

In the present embodiment, the quartz crystal resonator 10 is used as the resonator. The resonation device using the quartz crystal resonator as the resonator corresponds to the quartz crystal oscillator. Although the quartz crystal resonators are higher in frequency stability than other resonators than the quartz crystal resonators, and are superior in frequency-temperature characteristic, the constant-temperature type provided with the heating element is adopted in order to further improve the accuracy. Therefore, by adopting the configuration described above with reference to FIGS. 1 through 3, the temperature of the quartz crystal resonator can be kept constant, and thus, the quartz crystal oscillator 1 of the constant temperature type high in accuracy and low in power consumption can be realized.

It should be noted that as shown in FIG. 1, in the present embodiment, the fixation terminals 60 are disposed on the four corners of the quartz crystal resonator 10, and the pairs of connection terminals 70 are disposed between the fixation terminals 60. However, the number and arrangement of the fixation terminals 60 are not limited thereto, but can freely be configured to, for example, 2, 3, 5, or 6 in accordance with the supporting stability of the quartz crystal resonator 10 or the size of the space. Further, the number and arrangement of the connection terminals 70 are increased or decreased in accordance with the number of input/output terminals of the quartz crystal resonator 10. Further, it is also possible to adopt a configuration in which the connection terminals 70 are disposed on the four corners of the quartz crystal resonator 10, and the fixation terminals 60 are disposed between the connection terminals 70.

Further, if is also possible to use bonding wires for the connection between the quartz crystal resonator 10 and the substrate 30 instead of the connection terminals 70.

Although in the embodiment described above, the explanation is presented citing the quartz crystal oscillator 1 as an example of the resonation device, it is possible to adapt the invention to other resonation devices besides the quartz crystal oscillator 1. There can be cited, for example, an angular velocity sensor, an acceleration sensor, a tilt sensor, a resonator using a piezoelectric element other than the quarts crystal, a MEMS (Micro Electro Mechanical System) resonator. Most of these devices use a method of measuring the physical quantity to be detected using the fact that the resonant frequency of the resonator incorporated therein varies in accordance with the level of the physical quantity. As described above, since the resonant frequency of the resonator has a temperature characteristic, by keeping the resonator at constant temperature using the heating element, accurate physical quantify measurement is realized.

Also in each of such resonation devices as described above, there can be adapted the configuration of the embodiment described above in which the connection terminals for performing the electrical connection and the fixation terminals for performing the mechanical fixation are functionally separated, and the insulating connection material is used for the connection between the resonator and the substrate with the fixation terminals. Therefore, it is possible to provide a resonation device high in reliability, having resistance to an external impact and vibration, in which there is no chance for the resonator to be fixed in the state in which the position with respect to the substrate and the posture are shifted when connecting or fixing the resonator to the substrate, and at the same time, the resonator can solidly be fixed to the substrate by increasing the mechanical strength of the fixation terminals. Further, by inhibiting the heat from being released from the resonator to the substrate via the fixation terminals, there can be obtained an advantage of suppressing the power supply to the heating element to thereby achieve the redaction of power consumption.

Manufacturing Method of Resonation Device

Then, a method of manufacturing the resonation device will be explained with reference to the drawings. Here, the explanation will be presented citing the quartz crystal oscillator 1 described above as an example of the resonation device.

Figure 4A:
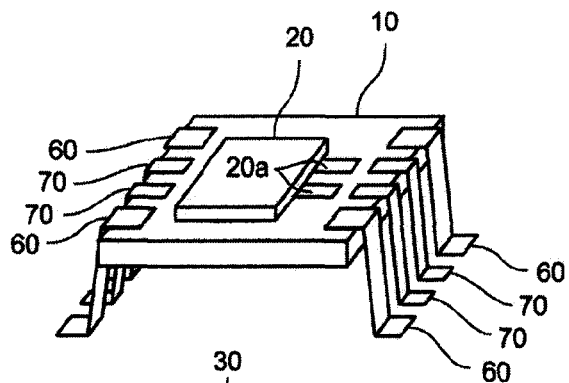
FIGS. 4A through 4E are diagrams showing principal processes of a method of manufacturing the quartz crystal oscillator according to the invention.

FIGS. 4A through 4E are diagrams showing principal processes of a method of manufacturing the quartz crystal oscillator 1 according to the invention. Firstly, as shown in FIG. 4A, an assembly obtained by attaching the heating element 20, the fixation terminals 60, and the connection terminals 70 to the quartz crystal resonator 10 is prepared as a front-end process. The heating element 20 is fixed to the quartz crystal resonator 10 with the thermosetting adhesive or solder, the connection terminals 70 are fixed to the quartz crystal resonator 10 with the electrically-conductive connection material 84, and the fixation terminals 60 are fixed to the quartz crystal resonator 10 with the insulating connection material 83.

It should be noted that in the case of forming the fixation terminals 60 and the connection terminals 70 with the same material, by forming a comb-like terminal member obtained by integrally joining the fixation terminals 60 and the connection terminals 70 at the tips of the second fixation terminal section 60b and the second connection terminal section 70b (see FIG. 1), and then cutting the joint after fixing the first fixation terminal section 60a and the first connection terminal section 70a to the quartz crystal resonator 10, the form shown in FIG. 4A can be obtained, and the manufacturing efficiency can be enhanced.

Subsequently, a process from application of connection material to curing of the connection material is performed using a surface-mount technology (SMT). As an SMT device, a reflow device (not shown) is used.

Figure 4B:
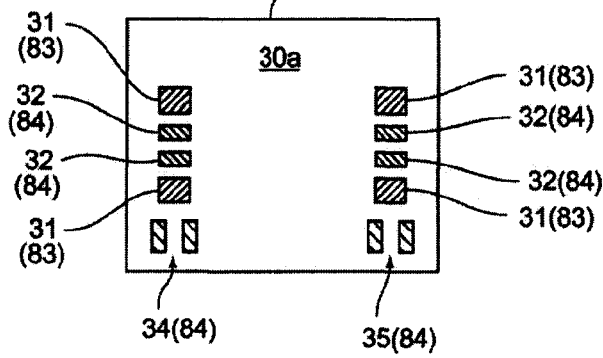

Firstly, the substrate 30 is prepared. As shown in FIG. 4B, on the principal surface 30a of the substrate 30, there are formed the electrodes 31 corresponding to the fixation terminals 60, the connecting electrodes 32 corresponding to the connection terminals 70, the element electrodes 34 corresponding to the oscillator circuit 91, and the element electrodes 35 corresponding to the heating element control circuit 92. The connection material is applied on these electrodes. As the connection material, the insulating connection material 83 (e.g., the epoxy adhesive) of the thermosetting typo is applied on the terminals 31, and the electrically-conductive connection material 84 (a solder paste) is applied on the connecting electrodes 32 and the element electrodes 34, 35. It is assumed that the melting temperature of the electrically-conductive connection material 84 is higher than the curing temperature of the insulating connection material.

It should foe noted that the insulating connection material 83 and the electrically-conductive connection material 84 are applied using printing or a dispenser, and in the case of applying one of the connection materials by printing, the other is preferably applied using the dispenser in a posterior process. Although the sequence of the application of the insulating connection material 83 and the application of the electrically-conductive connection material 84 is not limited, the application using the dispenser is performed after the application by printing.

Subsequently, the substrate 30 is conveyed to a chip mounter area. Subsequently, the quartz crystal resonator 10 to which the fixation terminals 60 and the connection terminals 70 are fixed shown in FIG. 4A is mounted in a predetermined position on the substrate 30 using a chip mounter so that the fixation terminals 60 and the connection terminals 70 are disposed in the application positions of the insulating connection material 83 and the electrically-conductive connection material 84. Further, the oscillator circuit 91 and the heating element control circuit 92 are mounted in predetermined positions of the element electrodes 34, 35.

Figure 4C:
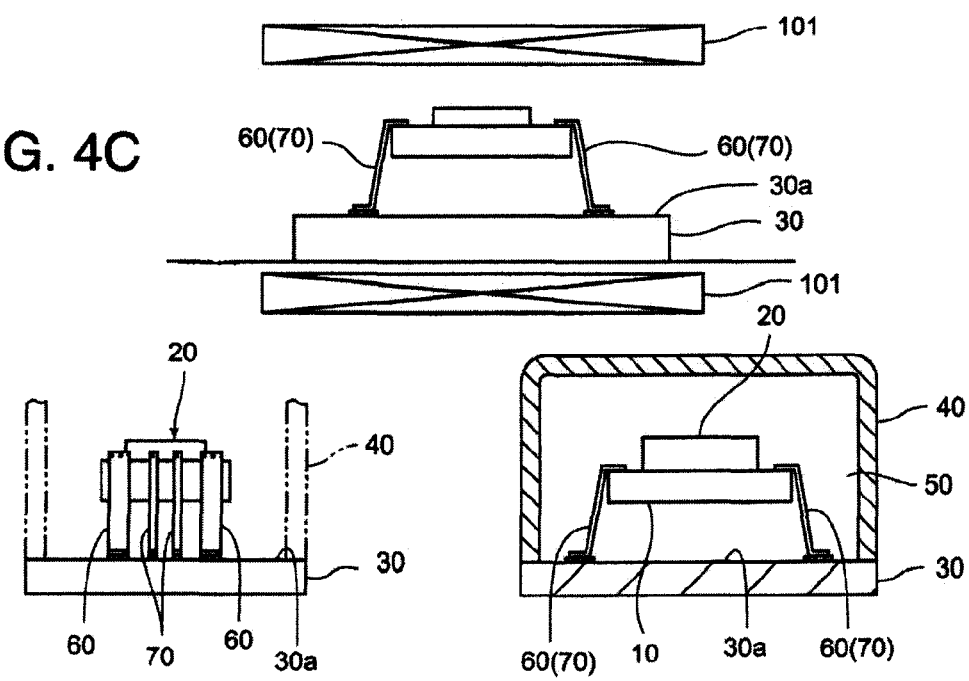
Figure 4D:
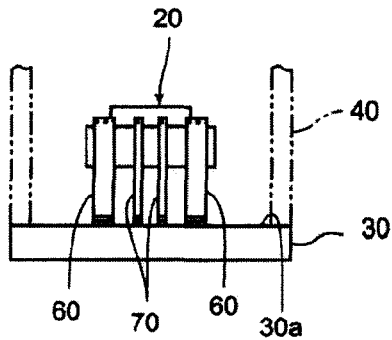
Figure 4E:
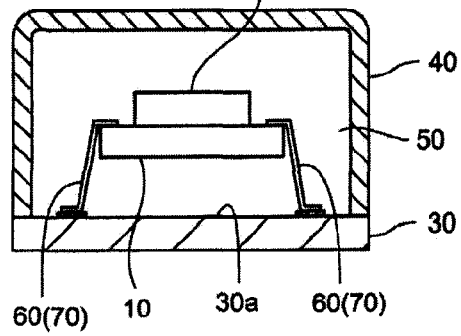

Subsequently, as shown in FIG. 4C, the quartz crystal resonator 10 shown in FIG. 4A to which the fixation terminals 60 and the connection terminals 70 are fixed is conveyed to a heating area (a reflow furnace) in a state (hereinafter expressed as a work) in which the quartz crystal resonator 10 is mounted on the substrate 30. Then, the work is heated. The heating is performed by heating units 101 disposed above and below the work. As the heating unit, there is used an infrared heater, a system for circulating hot air using a fan, or a system using the both. The heating is performed based on a reflow profile. The reflow profile will be explained with reference to FIG. 5.

Figure 5:
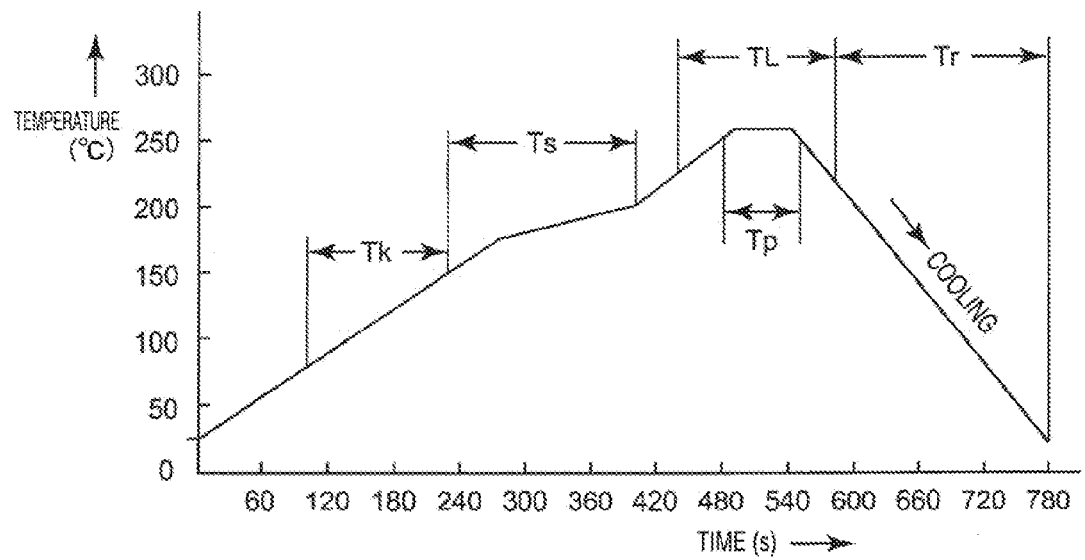
FIG. 5 is a reflow profile showing a relationship between heating time and temperature.

FIG. 5 is a reflow profile showing a relationship between heating time and temperature. It should be noted that the reflow profile is an example in the case of using the solder paste as the electrically-conductive connection material 84, and the thermosetting epoxy adhesive as the insulating connection material 83. The reflow profile shown in FIG. 5 includes a preheating area Ts, a main heating area TL, and a cooling area Tr. The reflow profile of the present embodiment is expressed based on the meltage of the solder paste. The preheating area Ts is an area for raising the temperature from 150° C. to 200° C., and the main heating area TL is an area including a peak temperature area Tp (250° C. through 260° C.). The peak temperature area Tp is an area for keeping the peak temperature (250° C. through 260° C.) for a certain period of time, and the cooling area Tr is an area for performing the cooling from the peak temperature area to normal temperature (25° C.).

In the preheating area Ts, softening of the solder paste begins, the wettability between the connecting electrodes 32 of the substrate 30 and the connection terminals 70 is enhanced, then the solder paste is melted in the main beating area TL, and then the curing is completed in the cooling area Tr. The cooling area Tr is a natural cooling area performed after taking out the substrate 30 from the reflow furnace. In some cases, rapid cooling is performed using a cooling bath in order to shorten the cooling time.

In the reflow profile, since the softening of the solder paste begins in the preheating area Ts, it is desirable that the epoxy adhesive has been made to cure at the temperature lower than the preheating area Ts. Therefore, in the present embodiment, a temperature range of 80° C. through 150° C. is defined as a fixation area Tk of the epoxy adhesive. As the epoxy resin, the connection material, which starts curing at 80° C., reaches the curing rate of 80% at 120° C., and exceeds the curing rate of 90% at 150° C., is selected. In other words, the fixation terminals 60 are fixed to the substrate 30 with the epoxy adhesive, and then the solder paste is melted passing through the preheating area Ts and then the main heating area.

Subsequently, the assembly in the state shown in FIG. 4A in which the quartz crystal resonator 10, to which the fixation terminals 60 and the connection terminals 70 are fixed, and the substrate 30 are fixed to each other is taken out from the reflow device, namely the reflow furnace, and is then cooled.

Subsequently, the lid member 40 is fixed to the substrate 30 to thereby configure the quartz crystal oscillator 1 having the space 50 surrounded by the substrate 30 and the lid member 40. The fixation between the substrate 30 and the lid member 40 can be achieved using a thermosetting adhesive, solder, or the like.

According to the method of manufacturing the resonation device explained hereinabove, it is possible to efficiently manufacture the resonation device having the connection terminals for achieving the electrical connection and the fixation terminals for achieving the mechanical fixation functionally separated from each other. Therefore, it is possible to manufacture a resonation device high in reliability, having resistance to an external impact and vibration, in which there is no chance for the resonator to be fixed in the state in which the position with respect to the substrate and the posture are shifted when connecting or fixing the resonator to the substrate, and at the same time, the resonator can solidly be fixed to the substrate by increasing the mechanical strength of the fixation terminals. Further, since there can be obtained the advantage of inhibiting the heat from being released from the resonator to the substrate via the fixation terminals, a resonation device suppressing the power supply to the heating element to thereby achieve the reduction of power consumption can efficiently be manufactured.

According to such a manufacturing method as described above, since the insulating connection material 83 is first made to cure at the temperature lower than the preheating area of the reflow profile, it is possible to fix the connection terminals 70 to the substrate 30 while preventing the position and the posture of the quartz crystal resonator 10 with respect to the substrate 30 from being shifted during the process of fixing the connection terminals 70 to the substrate 30.

Further, in the reflow profile, it results that the insulating connection material 83 is heated to the main heating area TL beyond the fixation area Tk, and the insulating connection material 83 can be provided with the hardness approximate to the hardness inherent in the material (approximate to the curing rate of 100%), and therefore, there can be provided the fixation strength between the quartz crystal resonator 10 and the substrate 30 sufficient to the vibration and the impact.

If should be noted that in the reflow profile, the fixation area Tk and the preheating area Ts can partially overlap each other. Further, in the case of using the electrically-conductive adhesive as the electrically-conductive connection material 84, the electrically-conductive adhesive is selected so that the curing temperature of the electrically-conductive connection material 84 is higher than the curing temperature of the insulating connection material 83.

It should be noted that the reflow profile shown in FIG. 5 is illustrative only, and the reflow profile is appropriately configured in accordance with the quality and the curing characteristics of the insulating connection material 83 and the electrically-conductive connection material 34 used actually.

Electronic Apparatus

Figure 6:
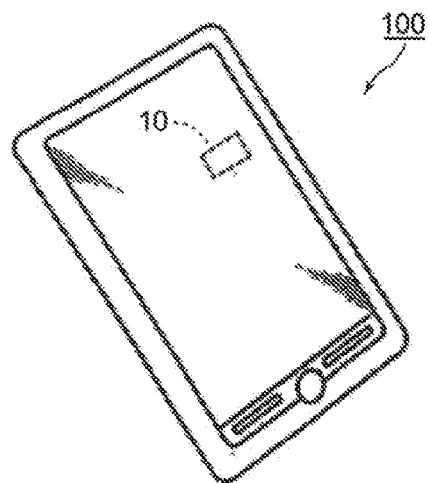
FIG. 6 is an overview diagram showing an example of an appearance of an electronic apparatus according to an application example.

The resonation device explained hereinabove can be installed in a variety of electronic apparatuses. For example, FIG. 6 shows an overview diagram of an electronic apparatus (a sophisticated mobile terminal 100) equipped with the quartz crystal oscillator 1 according to the present embodiment. In the sophisticated mobile terminal 100 shown in FIG. 6 incorporates, for example, an angular velocity sensor (not shown) for detecting the posture of the sophisticated mobile terminal 100, and the quartz crystal oscillator 1 according to the present embodiment can be used as a clock source for working the control mechanism of the angular velocity sensor. As described above, by using the quartz crystal oscillator 1 according to the present embodiment, a highly reliable electronic apparatus having resistance to an external impact, vibration, and so on can be realized.

It is possible to adopt a variety of electronic apparatuses as the electronic apparatus 200 equipped with the resonation device according to the present embodiment. There can be cited, for example, a personal computer (e.g., a mobile type personal computer, a laptop personal computer, and a tablet personal computer), a mobile terminal such as a cellular phone, a digital still camera, an inkjet ejection, device (e.g., an inkjet printer), a storage area network apparatus such as a router or a switch, a local area network apparatus, a television set, a video camera, a video cassette recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Moving Object

Figure 7:
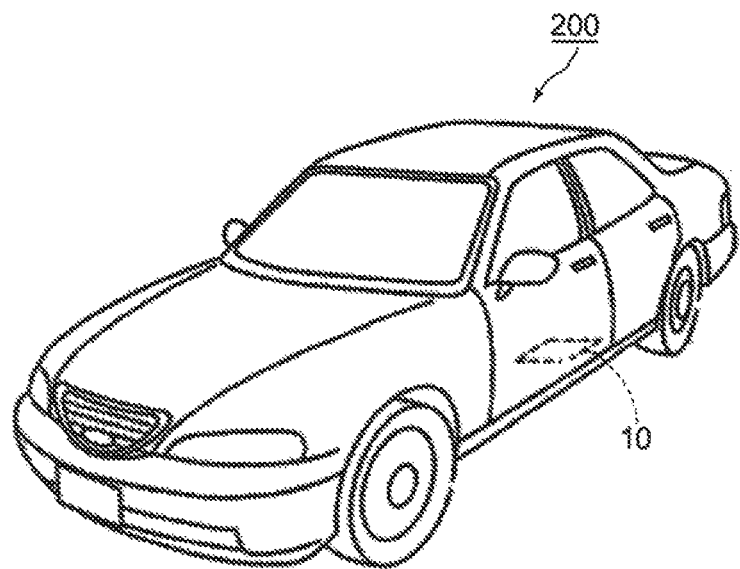
FIG. 7 is an overview diagram showing an example of an appearance of a moving object according to an application example.

The resonation device explained hereinabove can be installed in a variety of moving objects. For example, FIG. 7 shows a schematic diagram of a moving object (a vehicle) equipped with the quartz crystal oscillator 1 according to the present embodiment. For example, in the vehicle 200 shown in FIG. 7 incorporates an angular velocity sensor (not shown) for detecting the posture, and the quartz crystal oscillator 1 according to the present embodiment can be used as a clock source for working the control mechanism of the angular velocity sensor. As described above, by using the quarts crystal oscillator 1 according to the present embodiment, a highly reliable electronic apparatus having resistance to an external impact, vibration, and so on can be realized.

It is possible to adopt a variety of moving objects as the moving object 200 equipped with the quartz crystal oscillator 1 according to the present embodiment. For example, a vehicle (including an electric vehicle), an aircraft such a jet plane or a helicopter, a ship, a rocket, and an artificial satellite can be cited.

The invention includes configurations (e.g., configurations having the same function, the same way, and the same result, or configurations having the same object and the same advantage) substantially the same as any of the configurations described above as the embodiment of the invention or the modified example. Further, the invention includes configurations obtained by replacing a non-essential part of the configuration described as the embodiment and so on. Further, the invention includes configurations providing the same functions and the same advantage, or configurations capable of achieving the same object, as the configuration described as the embodiment and so on. Further, the invention includes configurations obtained by adding a known technology to the configuration described as the embodiment and so on.

The entire disclosure of Japanese Patent application No. 2013-71576, filed Mar. 29, 2013 is expressly incorporated by reference herein.

What is claimed is:

1. A resonation device comprising:
   a resonator;
   a substrate;
   a fixation terminal adapted to mechanically fixing the resonator and the substrate to each other; and
   a connection terminal adapted to electrically connect the resonator and the substrate to each other,
   wherein the connection between the fixation terminal and the substrate is achieved by an insulating connection material,
   the fixation terminal is distant from and not in direct contact with the connection terminal, and
   the connection terminal and the resonator, and the connection terminal and the substrate are each connected to each other with an electrically-conductive connection material.

2. The resonation device according to claim 1, wherein the insulating connection material and the electrically-conductive connection material are each a thermosetting connection material, and
   the electrically-conductive connection material is higher in curing temperature than the insulating connection material.

3. The resonation device according to claim 1, wherein the insulating connection material is a thermosetting connection material, the electrically-conductive connection material is a heat-melting connection material, and melting temperature of the electrically-conductive connection material is higher than curing temperature of the insulating connection material.

4. The resonation device according to claim 1, wherein the connection terminal includes a first connection terminal section connected to the resonator, a second connection terminal section connected to the substrate, and a third connection terminal section adapted to connect the first connection terminal section and the second connection terminal section to each other, the fixation terminal includes a first fixation terminal section connected to the resonator, a second fixation terminal section connected to the substrate, and a third fixation terminal section adapted to connect the first fixation terminal section and the second fixation terminal section to each other, and the third fixation terminal section is higher in rigidity than the third connection terminal section.

5. The resonation device according to claim 2, wherein the connection terminal includes a first connection terminal section connected to the resonator, a second connection terminal section connected to the substrate, and a third connection terminal section adapted to connect the first connection terminal section and the second connection terminal section to each other, the fixation terminal includes a first fixation terminal section connected to the resonator, a second fixation terminal section connected to the substrate, and a third fixation terminal section adapted to connect the first fixation terminal section and the second fixation terminal section to each other, and the third fixation terminal section is higher in rigidity than the third connection terminal section.

6. The resonation device according to claim 3, wherein the connection terminal includes a first connection terminal section connected to the resonator, a second connection terminal section connected to the substrate, and a third connection terminal section adapted to connect the first connection terminal section and the second connection terminal section to each other, the fixation terminal includes a first fixation terminal section connected to the resonator, a second fixation terminal section connected to the substrate, and a third fixation terminal section adapted to connect the first fixation terminal section and the second fixation terminal section to each other, and the third fixation terminal section is higher in rigidity than the third connection terminal section.

7. An electronic apparatus comprising:

the resonation device according to claim 1.

8. A moving object comprising:

the resonation device according to claim 1.

9. The resonation device according to claim 4, wherein a width of the third connection terminal section is smaller than a width of the third fixation terminal section.

10. The resonation device according to claim 4, wherein the first and second fixation sections have different insulating materials.

* * * * *